United States Patent
Chien et al.

(10) Patent No.: US 10,538,428 B2
(45) Date of Patent: Jan. 21, 2020

(54) MEMS DEVICE AND METHOD FOR MANUFACTURING THE SAME

(71) Applicant: MiraMEMS Sensing Technology Co., Ltd, Suzhou (CN)

(72) Inventors: Yu-Hao Chien, Taipei (TW); Li-Tien Tseng, Taoyuan (TW); Chih-Liang Kuo, Hsinchu (TW)

(73) Assignee: MIRAMEMS SENSING TECHNOLOGY CO., LTD, Suzhou (CN)

( * ) Notice: Subject to any disclaimer, the term of this patent is extended or adjusted under 35 U.S.C. 154(b) by 0 days.

(21) Appl. No.: 15/981,202

(22) Filed: May 16, 2018

(65) Prior Publication Data
US 2019/0225486 A1    Jul. 25, 2019

(30) Foreign Application Priority Data
Jan. 23, 2018 (CN) .......................... 2018 1 0065286

(51) Int. Cl.
*B81B 7/02* (2006.01)
*B81C 1/00* (2006.01)

(52) U.S. Cl.
CPC ............ *B81B 7/02* (2013.01); *B81C 1/00269* (2013.01); *B81B 2201/0264* (2013.01); *B81B 2203/033* (2013.01)

(58) Field of Classification Search
CPC .............. B81B 7/02; B81B 2201/0264; B81B 2203/033; B81C 1/00269
USPC ........................................................ 257/415
See application file for complete search history.

(56) References Cited

U.S. PATENT DOCUMENTS

| | | | |
|---|---|---|---|
| 2014/0227817 A1* | 8/2014 | Chien | B81C 1/0023 438/51 |
| 2015/0375994 A1* | 12/2015 | Chien | B81C 1/00293 257/43 |

\* cited by examiner

*Primary Examiner* — Matthew C Landau
*Assistant Examiner* — Dmitriy Yemelyanov
(74) *Attorney, Agent, or Firm* — Muncy, Geissler, Olds & Lowe, PC

(57) ABSTRACT

A method for manufacturing a MEMS device includes disposing at least one bonding portion having a smaller bonding area in a region where an airtight chamber will be formed, and disposing a metal getter on a bonding surface of the bonding portion. According to this structure, when substrates are bonded to define the airtight chamber, the metal getter is squeezed out of the bonding position due to the larger bonding pressure of the bonding portion with a smaller bonding area. Then, the metal getter is activated to absorb the moisture in the airtight chamber. According to the above process, no additional procedure is needed to remove the moisture in the airtight chamber. A MEMS device manufactured by the above manufacturing method is also disclosed.

11 Claims, 5 Drawing Sheets

MEMS DEVICE AND METHOD FOR MANUFACTURING THE SAME

BACKGROUND OF THE INVENTION

1. Field of the Invention

The present invention relates a MEMS device and a method for manufacturing the same, particularly to a MEMS device having an airtight chamber and a method for manufacturing the same.

2. Description of the Prior Art

Since the concept of the microelectromechanical system (MEMS) emerged in 1970s, MEMS devices have evolved from the targets explored in laboratories into the objects integrated with high-level systems. Nowadays, MEMS devices have been extensively used in consumer electronics, and the application thereof is still growing stably and fast. A MEMS device includes a mobile MEMS component. The function of a MEMS device may be realized through measuring the physical magnitude of the movement of the MEMS component.

In order to measure various types of physical magnitudes, some MEMS devices contain an airtight chamber. For example, a MEMS pressure sensor contains an airtight chamber; while the external pressure is varying, the pressure difference between the airtight chamber and the external environment induces a membrane to deform; the deformation of the membrane is sensed and used to calculate the external pressure. It is learned from the abovementioned principle: the airtightness and the internal humidity of the airtight chamber would influence the reliability of the MEMS pressure sensor.

Accordingly, the method to remove moisture from MEMS devices with less fabrication procedures has become a target the manufacturers are eager to achieve.

SUMMARY OF THE INVENTION

The present invention provides a MEMS device and a method for manufacturing the same, wherein at least one bonding portion with a smaller bonding area is formed in an airtight chamber, and a metal getter is disposed on the bonding surface of the bonding portion, whereby while the substrates are bonded together, the bonding portion with a smaller area experiences a larger bonding pressure, and whereby the metal getter is squeezed out of the bonding position to absorb the moisture in the airtight chamber, wherefore the method of the present invention can remove the moisture in the airtight chamber without using additional fabrication procedures.

In one embodiment, the MEMS device of the present invention comprises a first substrate, a second substrate, and a metal getter. The first substrate includes an active surface. The active surface further includes a first electric-conduction contact, at least one second electric-conduction contact, at least one third electric-conduction contact, and a fixed electrode. The second substrate includes a first surface, a second surface opposite to the first surface, a first bonding portion, at least one second bonding portion, and a movable element. The first bonding portion and the second bonding portion are disposed in the first surface of the second substrate. The first bonding portion surrounds the movable element. The second bonding portion is disposed between the first bonding portion and the movable element. The first bonding portion and the second bonding portion of the second substrate are respectively bonded to the first electric-conduction contact and the second electric-conduction contact of the first substrate, whereby the movable element is corresponding to the fixing electrode, and whereby the first substrate, the second substrate and the first bonding portion jointly define an airtight chamber. The metal getter is disposed between the first bonding portion and the second electric-conduction contact and extended outward.

In one embodiment, the method for manufacturing a MEMS device of the present invention comprises steps as following: providing a first substrate including an active surface, wherein the active surface further includes a first electric-conduction contact, at least one second electric-conduction contact, at least one third electric-conduction contact, and a fixed electrode; providing a second substrate including a first surface and a second surface opposite to the first surface; forming a groove on the first surface or the second surface of the second substrate to define a movable element; forming a first bonding portion and at least one second bonding portion in the first surface of the second substrate, wherein the first bonding portion surrounds the movable element, and the second bonding portion is disposed between the first bonding portion and the movable element, and wherein the bonding surface of the first bonding portion is larger than the bonding surface of the second bonding portion; disposing a bonding material on the first bonding portion, and disposing a metal getter on the bonding surface of the second bonding portion; bonding the first substrate to the second substrate, wherein the first bonding portion is bonded to the first electric-conduction contact, and the second bonding portion is bonded to the second electric-conduction contact, whereby the first substrate, the second substrate and the first bonding portion jointly define an airtight chamber, and whereby the movable element is corresponding to the fixed electrode, and whereby the metal getter on the second bonding portion is squeezed out of the bonding surface of the second bonding portion; and activating the metal getter to absorb the moisture in the airtight chamber.

Below, embodiments are described in detailed in cooperation with the attached drawings to make easily understood the objectives, technical contents, characteristics and accomplishments of the present invention.

DESCRIPTION OF THE PREFERRED EMBODIMENTS

Figure 1:
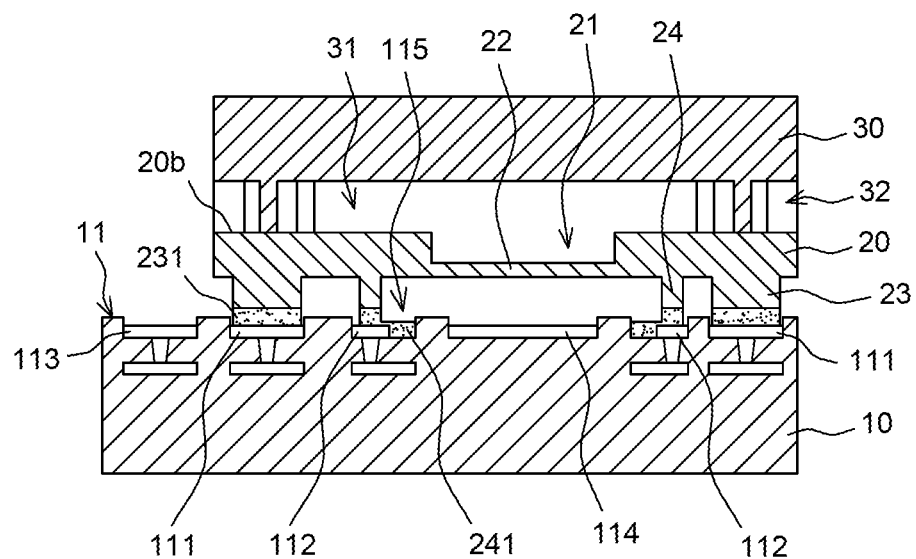
FIG. 1 is a diagram schematically showing a MEMS device according to one embodiment of the present invention.

The present invention will be described in detail with embodiments and attached drawings below. However, these embodiments are only to exemplify the present invention but not to limit the scope of the present invention. In addition to the embodiments described in the specification, the present invention also applies to other embodiments. Further, any modification, variation, or substitution, which can be easily made by the persons skilled in that art according to the embodiment of the present invention, is to be also included within the scope of the present invention, which is based on the claims stated below. Although many special details are provided herein to make the readers more fully understand the present invention, the present invention can still be practiced under a condition that these special details are partially or completely omitted. Besides, the elements or steps, which are well known by the persons skilled in the art, are not described herein lest the present invention be limited unnecessarily. Similar or identical elements are denoted with similar or identical symbols in the drawings. It should be noted: the drawings are only to depict the present invention schematically but not to show the real dimensions or quantities of the present invention. Besides, matterless details are not necessarily depicted in the drawings to achieve conciseness of the drawings.

Refer to FIG. 1. In one embodiment, the MEMS device of the present invention comprises a first substrate 10, a second substrate 20, and a metal getter 241. The first substrate 10 includes an active surface 11. The active surface 11 further includes a first electric-conduction contact 111, at least one second electric-conduction contact 112, at least one third electric-conduction contact 113, and a fixed electrode 114. In the embodiment shown in FIG. 1, the first substrate 10 includes a plurality of metal layers, which are connected by interconnection structures to form the desired circuit. Parts of the topmost metal layer are exposed on the surface of the first substrate 10 to function as the first electric-conduction contact 111, the second electric-conduction contact 112, the third electric-conduction contact 113, and the fixed electrode 114.

Figure 3:
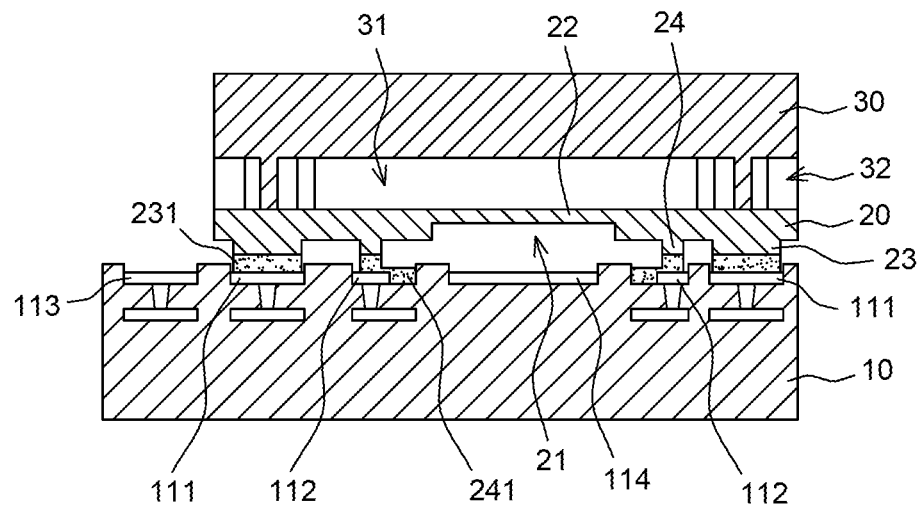
FIG. 3 is a diagram schematically showing a MEMS device according to another embodiment of the present invention.

The second substrate 20 includes a first surface (i.e. the lower surface of the second substrate 20 shown in FIG. 1), a second surface 20b opposite to the first surface, a first bonding portion 23, at least one second bonding portion 24, and a movable element 22. In the embodiment shown in FIG. 1, a groove 21 is formed on the second surface 20b of the second substrate 20 to define the thickness of the movable element 22. However, the present invention is not limited by the embodiment shown in FIG. 1. Refer to FIG. 3. In one embodiment, a groove 21 is formed on the first surface (i.e. the lower surface of the second substrate 20 shown in FIG. 3) of the second substrate 20 to define the thickness of the movable element 22.

Refer to FIG. 1 again. The first bonding portion 23 and the second bonding portion 24 are disposed in the first surface of the second substrate 20. The first bonding portion 23 surrounds the movable element 22. The second bonding portion 24 is disposed between the first bonding portion 23 and the movable element 22. The second substrate 20 is bonded to the first substrate 10 through the first bonding portion 23 and the second bonding portion 24. The first bonding portion 23 of the second substrate 20 is bonded to the first electric-conduction contact 111 of the first substrate 10. The second bonding portion 24 of the second substrate 20 is bonded to the second electric-conduction contact 112. It is easily understood: the movable element 22 of the second substrate 20 is corresponding to the fixed electrode 114 of the first substrate 10 to form a sensing capacitor. The first substrate 10, the second substrate 20 and the first bonding portion 23 jointly define an airtight chamber. In one embodiment, the MEMS device of the present invention is a MEMS pressure sensor; the pressure difference between the airtight chamber and the external environment induces the movable element 22 to deform; the pressure of the external environment can be worked out via measuring the capacitance variation of the movable element 22 and the fixed electrode 114. In one embodiment, a reference element and a reference electrode corresponding to the reference element are used to generate a reference capacitance to increase the accuracy of measurement. Generally, the reference capacitance is unlikely to vary with the variation of the pressure of the external environment. Therefore, the reference capacitance can be used to obtain a more accurate value of the capacitance variation. However, the related elements and detailed structure of the reference capacitor are not the focuses of the present invention and will repeat herein.

Figure 2:
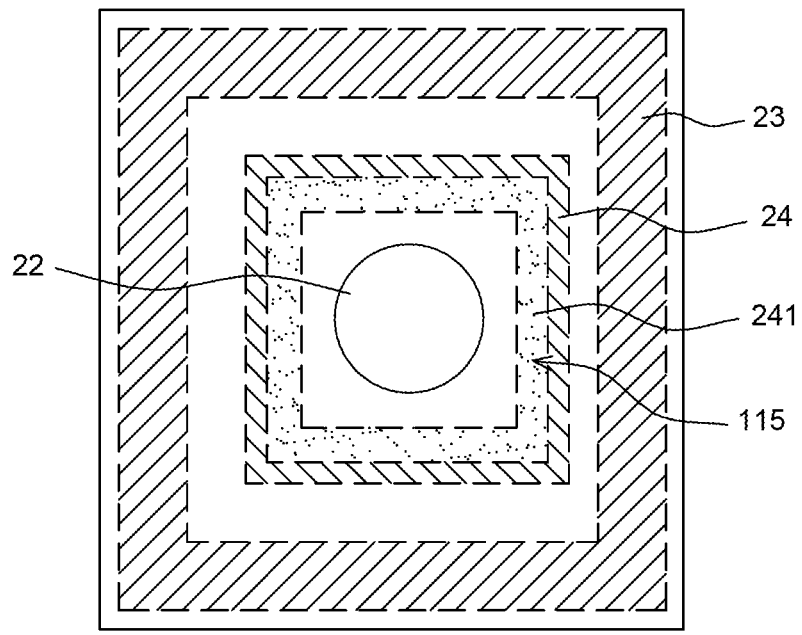
FIG. 2 is a top view schematically the relative positions of the components of a MEMS device according to one embodiment of the present invention.

The metal getter 241 is disposed between the second bonding portion 24 and the second electric-conduction contact 112 and extended outward. In other words, the metal getter 241 exceeds the projection area of the second bonding portion 24 to the second electric-conduction contact 112. For example, while the second substrate 20 is bonded to the first substrate 10, the metal getter 241 is squeezed to extend out. Refer to FIG. 2. In one embodiment, the active surface 11 of the first substrate 10 has at least one limiting trench 115, which is disposed between the second electric-conduction contact 112 and the fixed electrode 114. The limiting trench 115 limits the area where the squeezed metal getter 241 is allowed to extend lest the metal getter 241 touch the fixed electrode 114. After being activated, the metal getter 241 can absorb the moisture inside the airtight chamber. In one embodiment, the metal getter 241 is activated by the current conducted through the third electric-conduction contact 113. In one embodiment, the material of the metal getter 241 may be but is not limited to be selected from a group including germanium, aluminum, indium, gold, tin, titanium, chromium, copper, and combinations thereof.

In one embodiment, the bonding surface of the first bonding portion 23 is larger than the bonding surface of the second bonding portion 24. Therefore, while the second substrate 20 is bonded to the first substrate 10, greater pressure is generated between the second bonding portion 24 and the second electric-conduction contact 112, so as to squeeze out the metal getter 241 between the second bonding portion 24 and the second electric-conduction contact 112. Refer to FIG. 2 again. In one embodiment, the second bonding portion 24 is a continuous structure surrounding the movable element 22. Thus, the first substrate 10, the second substrate 20 and the second bonding portion 24 jointly define another airtight chamber. Hence, the inner airtight chamber is encircled by the outer airtight chamber. Then, the airtightness of the inner airtight chamber is greatly enhanced.

Figure 4:
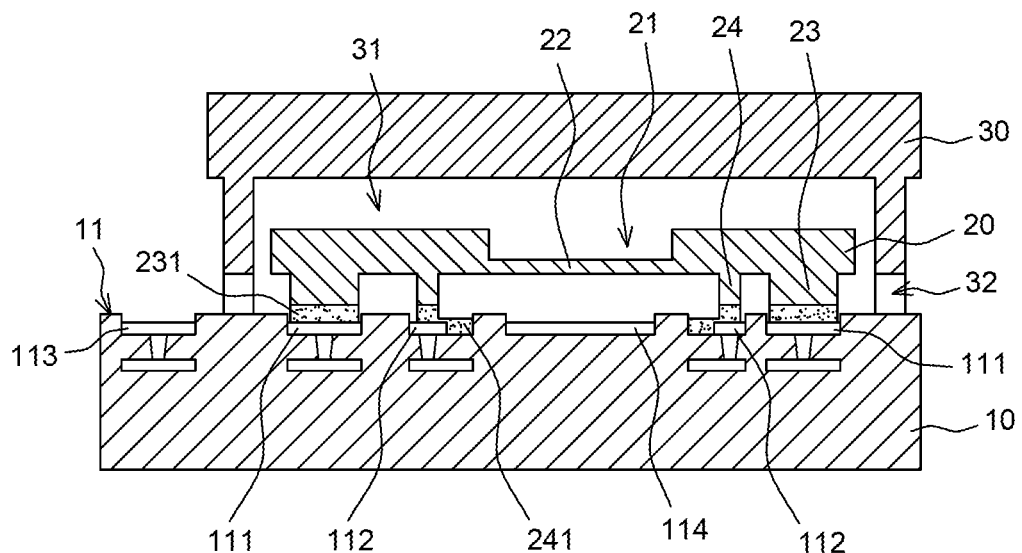
FIG. 4 is a diagram schematically showing a MEMS device according to yet another embodiment of the present invention.

Refer to FIG. 1 again. In one embodiment, the MEMS device of the present invention further comprises a third substrate 30. The third substrate 30 has a recessed region 31 and a runner 32. The runner 32 interconnects the recessed region 31 with the exterior. In the embodiment shown in FIG. 1, the third substrate 30 is bonded to the second surface 20b of the second substrate 20, and the recessed region 31 is corresponding to the movable element 22 of the second substrate 20. The third substrate 30 may function as a cover to protect the movable element 22. The recessed region 31 is interconnected with the exterior through the crooked runner 32. Therefore, the movable element 22 is less likely to be contaminated by the particles of the external environment but can still deform in response to the pressure variation of the external environment. Refer to FIG. 4. In one embodiment, the third substrate 30 is bonded to the active surface 11 of the first substrate 10.

Figure 5A:
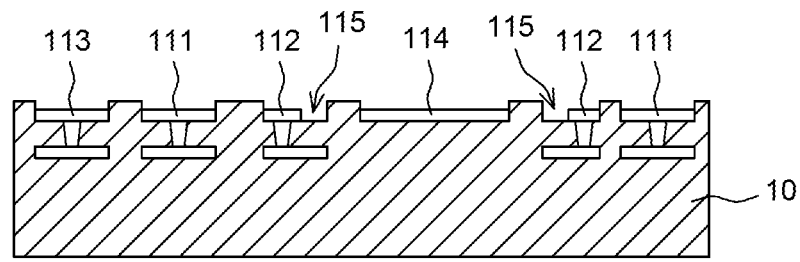
FIGS. 5a-5i are diagrams schematically the steps of a method for manufacturing a MEMS device according to one embodiment of the present invention.

Refer to FIGS. 5a-5i, which assist in the description of a method for manufacturing a MEMS device according to one embodiment of the present invention. In one embodiment, the method of the present invention comprises following steps. Firstly, provide a first substrate 10, which includes an active surface 11. The first substrate 10 includes driver circuits and/or sensor circuits, etc. The first substrate 10 may adopt an analog circuit and/or a digital circuit, which is usually realized by application-specific integrated circuit (ASIC) elements. The first substrate 10 may also be called the electrode substrate. In one embodiment, the first substrate 10 is a substrate having appropriate mechanical rigidity, such as a Complementary Metal Oxide Semiconductor (CMOS) substrate or a glass substrate. Although there is only a single device depicted in the sectional drawings, a plurality of chips may be fabricated in the single substrate in fact. Therefore, the single device depicted in the drawings is merely for exemplification. The present invention does not limit that only a single device can be fabricated in the substrate. It will be described in the specification below: a plurality of chips or devices is fabricated in a substrate with a wafer-grade process; these chips in the single substrate are singulated into separate dices and then packaged. The active surface 11 of the first substrate 10 has a first electric-conduction contact 111, at least one second electric-conduction contact 112, at least one third electric-conduction contact 113, and a fixed electrode 114. In one embodiment, the dielectric layer is partially removed to expose some areas of the topmost metal layer to function as the first electric-conduction contact 111, the second electric-conduction contact 112, the third electric-conduction contact 113, and the fixed electrode 114, as shown in FIG. 5a. In one embodiment, the dielectric layer is removed appropriately to form a desired limiting trench 115. In one embodiment, the material of the metal layer is selected from a group including aluminum, an aluminum-copper-silicon alloy, tungsten, or titanium nitride.

Figure 5B:
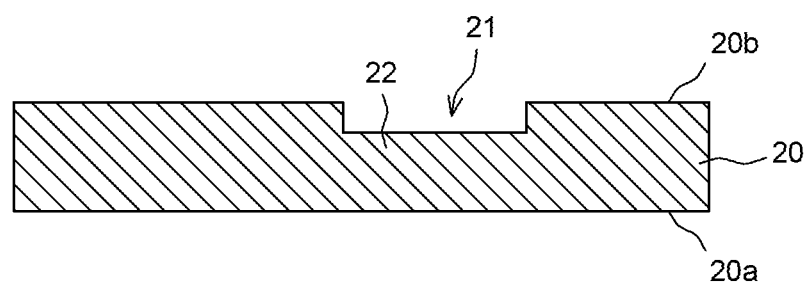

Next, provide a second substrate 20. The second substrate 20 includes a first surface 20a and a second surface 20b opposite to the first surface 20a. As shown in FIG. 5b, a groove 21 is formed on the second surface 20b to define the movable element 22 (refer to FIG. 1 also). It is easily understood: the groove 21 may be formed on the first surface 20a of the second substrate 20 to realize the embodiment shown in FIG. 3.

Figure 5C:
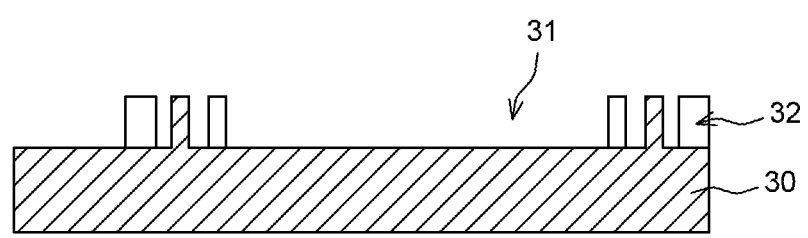
Figure 5D:
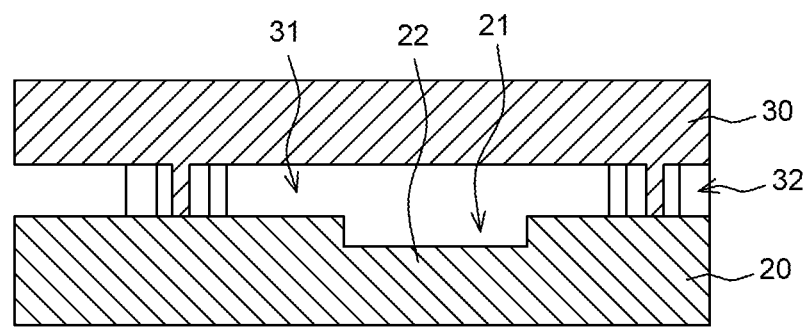

Refer to FIG. 5c. Next, provide a third substrate 30. A recessed region 31 and a runner 32 are formed on the third substrate 30. The recessed region 31 is interconnected with the exterior through the runner 32. Refer to FIG. 5d. Next, bond the third substrate 30 to the second surface 20b of the second substrate 20. The recessed region 31 of the third substrate 30 is corresponding to the movable element 22 of the second substrate 20. In one embodiment, the third substrate 30 is bonded to the second substrate 20 in at least one of a eutectic bonding technology, which comprising a fusion bonding technology, a soldering technology, and an adhesion technology.

Figure 5E:
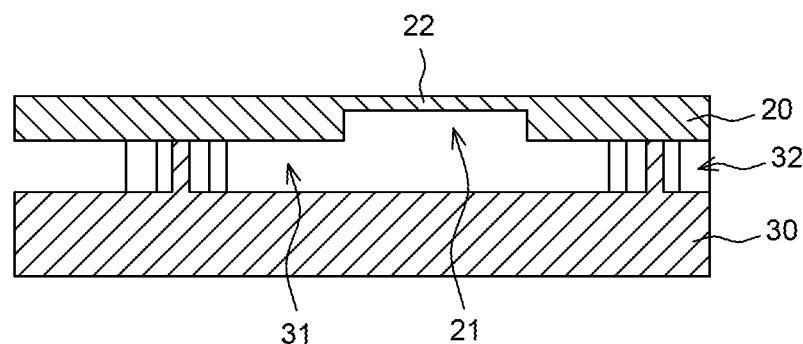

Refer to FIG. 5e. Next, thin the second substrate 20 with a grinding technology or another thinning technology to define the thickness of the movable element 22. In one embodiment, the thinned second substrate 20 has a thickness of less than or equal to 10 μm to 100 μm. A conventional thinning technology, such as the Chemical Mechanical Polishing (CMP) technology or the Reactive Ion Etching (RIE) technology, may be used to achieve a specified thickness. A thinning process, which is not precisely controlled, would make the second substrate 20 thinner or thicker than the desired thickness. The unqualified second substrate 20 would affect the performance of the MEMS device. The persons having ordinary knowledge in the field should be able to modify or vary these embodiments or substitute the components used in these embodiments without departing from the spirit of the present invention.

Figure 5F:
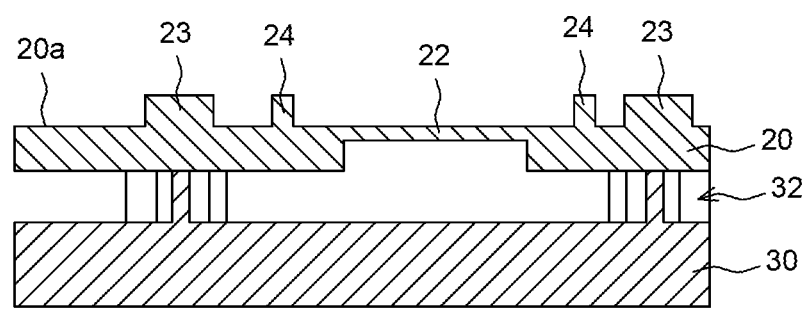

Refer to FIG. 5f. Next, form a first bonding portion 23 and at least one second bonding portion 24 on the first surface 20a of the second substrate 20, wherein the first bonding portion 23 surrounds the movable element 22, and the second bonding portion 24 is disposed between the first bonding portion 23 and the movable element 22. In one embodiment, the first bonding portion 23 and the second bonding portion 24 are generated via depositing an appropriate material on the first surface 20a of the second substrate 20. However, the present invention does not limit that the first bonding portion 23 and the second bonding portion 24 must be generated in a deposition method. In one embodiment, the protruding first bonding portion 23 and second bonding portion 24 are generated via removing parts of the second substrate 20. In one embodiment, the bonding surface of the first bonding portion 23 is larger than the bonding surface of the second bonding portion 24. It should be noted: the second bonding portion 24 in FIG. 2 is a continuous structure. However, the present invention does snot limit that the second bonding portion 24 must be a continuous structure. In one embodiment, a plurality of the second bonding portion 24 comprising discontinuous structure can also carry the metal getter 241.

Figure 5G:
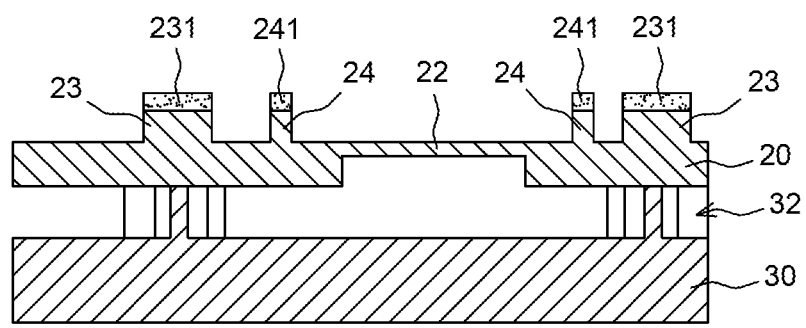

Refer to FIG. 5g. Next, form a bonding material 231 on the bonding surface of the first bonding portion 23, and form a metal getter 241 on the bonding surface of the second bonding portion 24. In one embodiment, the bonding material 231 contains germanium, aluminum, or copper. In another embodiment, the bonding material 231 also adopts another material, such as gold, indium, or a solder material able to provide wetting ability and adhesion ability and improve the stacking ability of metals. The metal getter 241 may be but is not limited to be germanium, aluminum, indium, gold, tin, titanium, copper, or combinations thereof. In one embodiment, the bonding material 231 and the metal getter 241 adopt the same material to simplify the fabrication process.

Figure 5H:
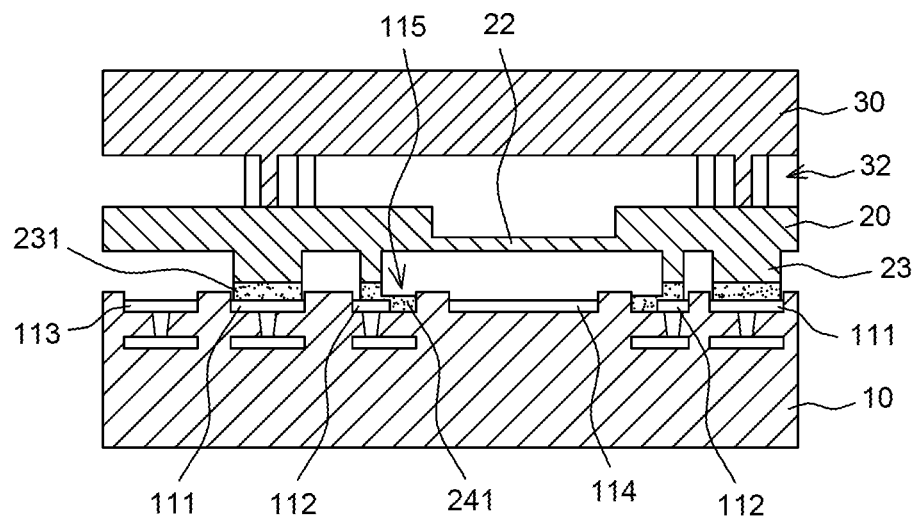

Refer to FIG. 5h. Next, bond the second substrate 20 to the first substrate 10, wherein the first bonding portion 23 of the second substrate 20 is bonded to the first electric-conduction contact 111 of the first substrate 10, and the second bonding portion 24 of the second substrate 20 is bonded to the second electric-conduction contact 112. Thereby, the first substrate 10, the second substrate 20, and the first bonding portion 23 jointly define an airtight chamber. In one embodiment, the bonding of the first substrate 10 and the second substrate 20 is realized with a eutectic bonding technology or a fusion bonding technology. The movable element 22 of the second substrate 20 is corresponding to the fixed electrode 114 of the first substrate 10 to form a sensing capacitor. The bonding surface of the first bonding portion 23 is larger than the bonding surface of the second bonding portion 24. Therefore, while the second substrate 20 is bonded to the first substrate 10, the pressure between the second bonding portion 24 and the second electric-conduction contact 112 is greater than the pressure between the first bonding portion 23 and the first electric-conduction contact 111 under the same bonding pressure.

Thus, the metal getter 241 between the second bonding portion 24 and the second electric-conduction contact 112 is squeezed out and extended outward. In one embodiment, the metal getter 241 is filled into the limiting trench 115 of the first substrate 10.

Figure 5I:
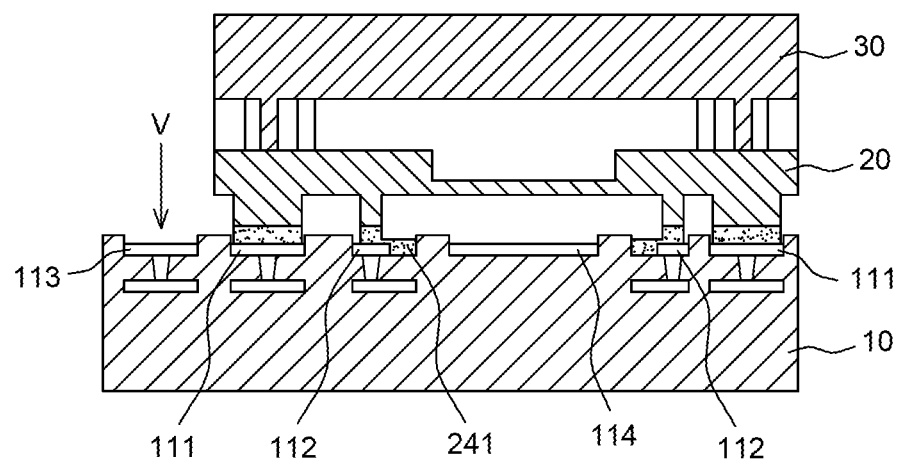

Refer to FIG. 5i. Next, remove parts of the second substrate 20 and the third substrate 30 to expose the third electric-conduction contact 113 of the first substrate 10. A voltage V is supplied through the third electric-conduction contact 113 to activate the metal getter 241. Thereby, the metal getter 241 absorbs the moisture inside the airtight chamber. According to the method shown in FIGS. 5a-5i, the present invention can use the original fabrication procedures to dispose the metal getter in the airtight chamber without using additional fabrication procedures. Therefore, the present invention can significantly shorten the fabrication process and reduce the fabrication cost.

It should be explained: the sequence and contents of the fabrication steps shown in FIGS. 5a-5i may be modified for fabricating different MEMS devices. For an example, while the MEMS device shown in FIG. 3 is to be fabricated, the second substrate 20 is bonded to the first substrate 10 beforehand, and the third substrate 30 is bonded to the second substrate 20 after the second substrate 20 is thinned to a specified thickness. For another example, while the MEMS device shown in FIG. 4 is to be fabricated, the first substrate 10 is bonded to the second substrate 20, and then the third substrate 30 is bonded to the first substrate 10.

In conclusion, the present invention proposes a MEMS device and a method for manufacturing the same, wherein at least one bonding portion with a smaller bonding area is formed in an airtight chamber, and wherein a metal getter is disposed on the bonding surface of the bonding portion. While the substrates are bonded to each other, the bonding portion with a smaller bonding area experiences a larger pressure. Thus, the metal getter is squeezed out of the bonding position. The squeezed-out metal getter is activated to absorb the moisture inside the airtight chamber. Therefore, the method of the present invention can use the metal getter to remove the moisture inside the airtight chamber without using additional procedures.

The embodiments have been described above to demonstrate the technical thoughts and characteristics of the present invention to enable the persons skilled in the art to understand, make, and use the present invention. However, these embodiments are only to exemplify the present invention but not to limit the scope of the present invention. Any equivalent modification or variation according to the spirit of the present invention is to be also included by the scope of the present invention.

What is claimed is:

1. A microelectromechanical system (MEMS) device comprising
a first substrate including an active surface, wherein the active surface further includes a first electric-conduction contact, at least one second electric-conduction contact, at least one third electric-conduction contact, and a fixed electrode, wherein the active surface of the first substrate has at least one limiting trench disposed between the second electric-conduction contact and the fixed electrode;
a second substrate including a first surface, a second surface opposite to the first surface, a first bonding portion, at least one second bonding portion, and a movable element, wherein the first bonding portion and the second bonding portion are disposed on the first surface of the second substrate; the first bonding portion surrounds the movable element; the second bonding portion is disposed between the first bonding portion and the movable element; the first boding portion and the second bonding portion of the second substrate are respectively bonded to the first electric-conduction contact and the second electric-conduction contact of the first substrate to make the movable element corresponding to the fixed electrode and make the first substrate, the second substrate and the first bonding portion jointly define an airtight chamber; and a metal getter disposed between the second bonding portion and the second electric-conduction contact, and extended within the limiting trench exposed to the airtight chamber without directly contacting the fixed electrode.

2. The MEMS device according to claim 1, wherein a bonding surface of the first bonding portion is larger than a bonding surface of the second bonding portion.

3. The MEMS device according to claim 1, wherein the second bonding portion is a continuous structure surrounding the movable element.

4. The MEMS device according to claim 1, wherein the metal getter is electrically activated through the third electric-conduction contact.

5. The MEMS device according to claim 1, wherein a material of the metal getter is the same as a bonding material between the first bonding portion and the first electric-conduction contact.

6. The MEMS device according to claim 1, wherein a material of the metal getter comprising germanium, aluminum, indium, gold, tin, titanium, chromium, copper, or combinations thereof.

7. The MEMS device according to claim 1 further comprising
a third substrate including a recessed region and a runner, wherein the runner interconnects the recessed region with exterior; the third substrate is bonded to the second surface of the second substrate or the active surface of the first substrate; the recessed region is corresponding to the movable element.

8. The MEMS device according to claim 7, wherein the third substrate is bonded to the second substrate with at least one of a eutectic bonding technology, which comprising a fusion technology, a soldering technology, and an adhesion technology.

9. The MEMS device according to claim 1, wherein a groove is formed on the second surface of the second substrate to define the movable element.

10. The MEMS device according to claim 1, wherein the first substrate is bonded to the second substrate with a eutectic bonding technology or a fusion technology.

11. The MEMS device according to claim 1, which is a pressure sensor.

* * * * *